(12) United States Patent
Li

(10) Patent No.: US 11,294,434 B2
(45) Date of Patent: Apr. 5, 2022

(54) SWITCH ASSEMBLY STRUCTURE AND DISPLAY DEVICE

(71) Applicant: BOE TECHNOLOGY GROUP CO., LTD., Beijing (CN)

(72) Inventor: Jing Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 919 days.

(21) Appl. No.: 16/074,234

(22) PCT Filed: Feb. 8, 2018

(86) PCT No.: PCT/CN2018/075856
§ 371 (c)(1),
(2) Date: Jul. 31, 2018

(87) PCT Pub. No.: WO2019/019611
PCT Pub. Date: Jan. 31, 2019

(65) Prior Publication Data
US 2021/0026422 A1    Jan. 28, 2021

(30) Foreign Application Priority Data
Jul. 28, 2017    (CN) .......................... 201710632387.6

(51) Int. Cl.
*G06F 1/00*    (2006.01)
*G06F 1/18*    (2006.01)
(Continued)

(52) U.S. Cl.
CPC ........... *G06F 1/189* (2013.01); *H01H 9/0271* (2013.01); *H05K 7/1452* (2013.01)

(58) Field of Classification Search
CPC .......... G06F 1/189; G06F 1/1671; G06F 1/26; G06F 1/1601; G06F 2200/1612;
(Continued)

(56) References Cited

U.S. PATENT DOCUMENTS

2011/0228493 A1\*   9/2011   Liang .................... H04M 1/236
                                                       361/752
2014/0169732 A1    6/2014   Wang et al.
(Continued)

FOREIGN PATENT DOCUMENTS

CN       1327624 A      12/2001
CN     101730425 A       6/2010
(Continued)

OTHER PUBLICATIONS

First Office Action for CN Application No. 201710632387.6, dated Aug. 28, 2018.
(Continued)

*Primary Examiner* — Anatoly Vortman
*Assistant Examiner* — Zhengfu J Feng
(74) *Attorney, Agent, or Firm* — Dinsmore & Shohl LLP

(57) ABSTRACT

This disclosure provides a switch assembly structure and a display device. The switch assembly structure comprises: a switch assembly (100); an assembly housing (400) provided with a first groove (410); a first clamping member (500) provided with a second groove (510), wherein the first clamping member (500) has a first state of being securely connected with the assembly housing (400) and a second state of being separate from the assembly housing (400); wherein, in the second state, the switch assembly (100) is able to mate with the first groove (410) or the second groove (510); and in the first state, the first groove (410) and the second groove (510) combine to form a switch mounting hole (10), and the switch assembly (100) is secured in the switch mounting hole (10) by a securable connection of the first clamping member (500) with the assembly housing (400).

17 Claims, 4 Drawing Sheets

(51) Int. Cl.
*H01H 9/02* (2006.01)
*H05K 7/14* (2006.01)

(58) Field of Classification Search
CPC ...... H01H 9/0271; H01H 9/02; H05K 7/1452; G09F 9/00
USPC .................................................. 361/679.02
See application file for complete search history.

(56) References Cited

U.S. PATENT DOCUMENTS

2016/0217953 A1\* 7/2016 Ely .................. H03K 17/97
2019/0108951 A1\* 4/2019 Tsuchiya ............... G06F 1/1658

FOREIGN PATENT DOCUMENTS

| | | |
|---|---|---|
| CN | 202797806 U | 3/2013 |
| CN | 103841774 A | 6/2014 |
| CN | 203675505 U | 6/2014 |
| CN | 204046979 U | 12/2014 |
| CN | 107230566 A | 10/2017 |
| DE | 20 2008 000 250 U1 | 4/2008 |
| JP | 04-109518 | 4/1992 |
| JP | 2015012563 A \* | 1/2015 |

OTHER PUBLICATIONS

International Search Report and Written Opinion for International Appl. No. PCT/CN2018/075856, dated May 7, 2018.

\* cited by examiner

SWITCH ASSEMBLY STRUCTURE AND DISPLAY DEVICE

CROSS-REFERENCE TO RELATED APPLICATIONS

This application is a U.S. National Stage under 35 U.S.C. § 371 of International Application No. PCT/CN2018/075856 as filed on Feb. 8, 2018, which claims priority to Chinese Patent Application No. 201710632387.6, filed on Jul. 28, 2017. The disclosures of each of these applications are hereby incorporated herein by reference in their entirety into this application.

TECHNICAL FIELD

The present invention relates to a switch assembly structure and a display device.

BACKGROUND

On the display device, plugs and switch assemblies are essential components. For example, a plug arranged on the display device may be an aviation female plug, and the aviation female plug and the switch assembly are connected through wires for conduction, to control, through the switch assembly, connection or disconnection between devices connected with the aviation female plug and circuits inside the display device.

At present, a housing of the display device is provided with mounting holes corresponding to the aviation female plug and the switch assembly respectively. In the assembly of the overall display device, since the switch assembly comprises two parts with different dimensions, when mounting the switch assembly, an end with a smaller volume must be inserted into the mounting hole from the outside of the housing, and it can be mounted only in this way. However, as it is also needed to guarantee electrical connection between the switch assembly and the aviation female plug inside the display device, the aviation female plug and the switch assembly must be assembled separately (the aviation female plug must be inserted into the corresponding mounting hole from the inside of the housing, and the switch assembly must be inserted into the corresponding mounting hole from the outside of the housing), and then the two parts are welded together to achieve electrical connection.

SUMMARY

Specific embodiments of the present disclosure provide a switch assembly structure comprising:
a switch assembly;
an assembly housing provided with a first notch;
a first clamping member provided with a second notch, the first clamping member has a first state of being securely connected with the assembly housing and a second state of being separate from the assembly housing;
wherein, in the second state, the switch assembly is able to mate with the first notch or the second notch; and in the first state, the first notch and the second notch combine to form a switch mounting hole, and the switch assembly is secured in the switch mounting hole by a securable connection of the first clamping member with the assembly housing.

Alternatively, the switch assembly structure, wherein the switch assembly structure further comprises:
a plug connected with the switch assembly through a conductive member;
wherein, the assembly housing is further provided with a plug mounting hole, wherein the plug is inserted in the plug mounting hole.

Alternatively, the switch assembly structure, wherein, in the first state, the first notch is formed as one part of the switch mounting hole, and the second notch is formed as the other part of the switch mounting hole.

Alternatively, the switch assembly structure, wherein in the first state, the first clamping member covers one part of the first notch, the other part of the first notch is formed as the switch mounting hole, and the second notch coincides with a part of the other part of the first notch that forms the switch mounting hole.

Alternatively, the switch assembly structure, wherein in the first state, the assembly housing covers one part of the second notch, and the other part of the second notch is formed as the switch mounting hole, and the first notch coincides with the part of the second notch that forms the switch mounting hole.

Alternatively, the switch assembly structure, wherein the first notch is formed as a hole-shaped structure capable of making the switch assembly penetrate in a reciprocating manner.

Alternatively, the switch assembly structure, wherein the first notch comprises a first opening part and a second opening part communicating with each other, and through the first opening part, the whole switch assembly is able to penetrate the first notch in a reciprocating manner;
wherein, the first clamping member covers one part of the first opening part in the first state, and the second opening part combines with the other part of the first opening part to form the switch mounting hole.

Alternatively, the switch assembly structure, wherein the first opening part and the second opening part are respectively formed as quadrangular holes on a cross section perpendicular to the direction of inserting the switch assembly, which are symmetric with respect to the same line.

Alternatively, the switch assembly structure, wherein the switch assembly comprises a first structural part and a second structural part connected to each other, wherein a sectional area of the first structural part is larger than a sectional area of the second structural part, on a cross section parallel to a plane where the switch mounting hole is located;
wherein, in the first state, one part of the second structural part is secured in the switch mounting hole, and the first structural part is located on an outer surface of the assembly housing.

Alternatively, the switch assembly structure, wherein the first notch penetrates opposing first end face and second end face (e.g., a first end face and an opposing second end face, or opposing first and second end faces) of the assembly housing, and the second notch penetrates opposing first surface and second surface (e.g., a first surface and an opposing second surface, or opposing first and second surfaces) of the first clamping member;
wherein, in the first state, the first end face is in the same plane as the first surface and the second end face is in the same plane as the second surface.

Alternatively, the first clamping member is formed as a bent sheet structure, and a middle part of the first clamping member in which the second notch is arranged is bent towards the assembly housing with respect to the parts on both sides of the first clamping member.

Alternatively, the switch assembly structure, wherein the assembly housing is further provided with a third notch;

wherein the switch assembly structure further comprises:

a second clamping member provided with a fourth notch; wherein the second clamping member has a third state of being securely connected with the assembly housing and a fourth state of being separate from the assembly housing, wherein, in the third State, the third notch and the fourth notch combine to form the plug mounting hole.

Alternatively, the switch assembly structure, wherein, the plug is formed as a circular shape on a cross section perpendicular to the direction of plug insertion, and on the cross section perpendicular to the direction of plug insertion, the plug mounting hole is formed as a circular shape corresponding to the cross section of the plug.

Alternatively, the switch assembly structure, wherein, on a cross section perpendicular to the direction of plug insertion, the third notch and the fourth notch are respectively formed as a semicircular shape, and the third notch is formed as one part of the plug mounting hole, and the fourth notch is formed as the other part of the plug mounting hole.

Alternatively, the switch assembly structure, wherein the third notch penetrates opposing third end surface and fourth end face (e.g., a third end face and an opposing fourth end face, or opposing third and fourth end faces) of the assembly housing, and the fourth notch penetrates opposing third surface and fourth surface (e.g., a third surface and an opposing fourth surface, or opposing third and fourth surfaces) of the second clamping member;

wherein, in the third State, the third end face is in the same plane as the third surface, and the fourth end face is in the same plane as the fourth surface.

Alternatively, the second clamping member is formed as a bent sheet structure, and a middle part of the second clamping member in which the fourth notch is arranged is bent towards the assembly housing with respect to the parts on both sides of the second clamping member.

Specific embodiments of the present disclosure further provide a display device comprising the switch assembly structure according to any of the items described above.

DETAILED DESCRIPTION

Figure 1:
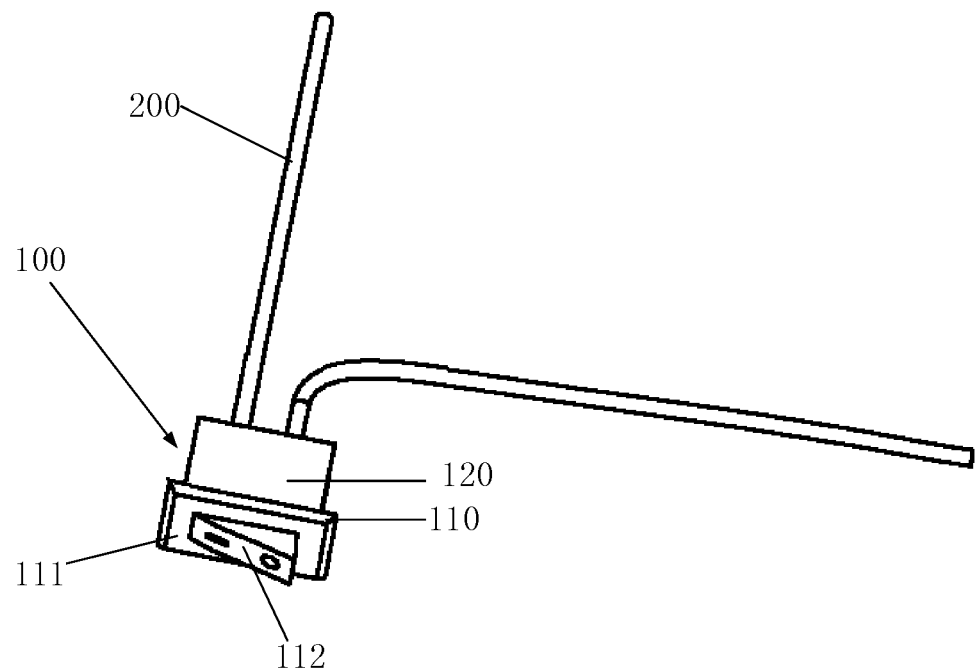
FIG. 1 is a schematic diagram showing a 3D structure of a switch assembly in the switch assembly structure according to an embodiment of this disclosure.

The technical solutions in the embodiments of the present disclosure are clearly and completely described in the following with reference to the accompanying drawings in the embodiments of the present disclosure. Evidently, the embodiments in the following description are only a part rather than all of the embodiments of the present disclosure. Based on the embodiments of the present disclosure, all other embodiments obtained by persons of ordinary skill in the art without creative effects shall fall within the protection scope of the present disclosure.

For the switch assembly structure adopted in the related technologies, since the switch assembly and the aviation female plug must be assembled separately, it results in a low assembling efficiency of the display device.

The objective of the technical solution of this disclosure is to provide a switch assembly structure and a display device, in order to solve the problem of low assembling efficiency of the display device because the switch assembly adopting the relevant technologies can be assembled only in a manner of inserting from the outside of the device into the inside thereof.

Specific embodiments of the present disclosure provide a switch assembly structure comprising:

a switch assembly;

an assembly housing provided with a first notch;

a first clamping member provided with a second notch, the first clamping member has a first state of being securely connected with the assembly housing and a second state of being separate from the assembly housing;

wherein, in the second state, the switch assembly is able to be combined and assembled with the first notch or the second notch; and in the first state, the first notch and the second notch combine to form a switch mounting hole, and the switch assembly is secured in the switch mounting hole by a securable connection of the first clamping member with the assembly housing.

By use of the switch assembly structure described in the specific embodiments of this disclosure, the switch mounting hole for inserting the switch assembly is formed by combining the first clamping member with the assembly housing. When mounting the switch assembly, the switch assembly can be firstly combined and connected with the separated first clamping member or assembly housing, and then the first clamping member is aligned and securely connected with the assembly housing, that is, a securable connection of the switch assembly on the assembly housing can be realized. By adopting the switch assembly structure, the direction of mounting the switch assembly is unnecessarily restricted to the direction from the outside of the assembly housing to the inside thereof, thus solving the problem of low assembling efficiency of the display device because the switch assembly adopting the relevant technologies can be assembled only in a manner of inserting from the outside of the device into the inside thereof.

In another aspect of the switch assembly structure according to an embodiment of this disclosure, the switch assembly structure further comprises:

a plug connected with the switch assembly through a conductive member;

wherein, the assembly housing is further provided with a plug mounting hole, wherein the plug is inserted in the plug mounting hole.

Based on the above, in the switch assembly structure described in the specific embodiment of this disclosure, the switch assembly and the plug connected with the switch assembly through a conductive member can be assembled on the assembly housing at the same time, which can improve the assembling efficiency of the switch assembly and the plug as compared with the related technologies.

FIG. 1 is a schematic diagram showing a 3D structure of a switch assembly in the switch assembly structure according to a specific embodiment of this disclosure. As shown in FIG. 1, the switch assembly 100 comprises a first structural part 110 and a second structural part 120 connected with each other, which are formed as a hexahedron shape. Further, a sectional area of the first structural part 110 is larger than a sectional area of the second structural part 120, on a cross section perpendicular to the setting direction of the first structural part 110 to the second structural part 120. In addition, an end face 111 of the first structural part 110 is provided with a press switch 112 for connecting or disconnecting the electrical devices connected.

Of course, the structure of the switch assembly 100 is not limited to the above shape, for example, the first structural part 110 and the second structural part 120 can be formed also as a cylindrical shape respectively. However, usually in order to facilitate assembling on the housing, the switch assembly 100 is composed of two parts with different sectional areas to prevent the switch assembly 100 from falling off the housing.

Figure 2:
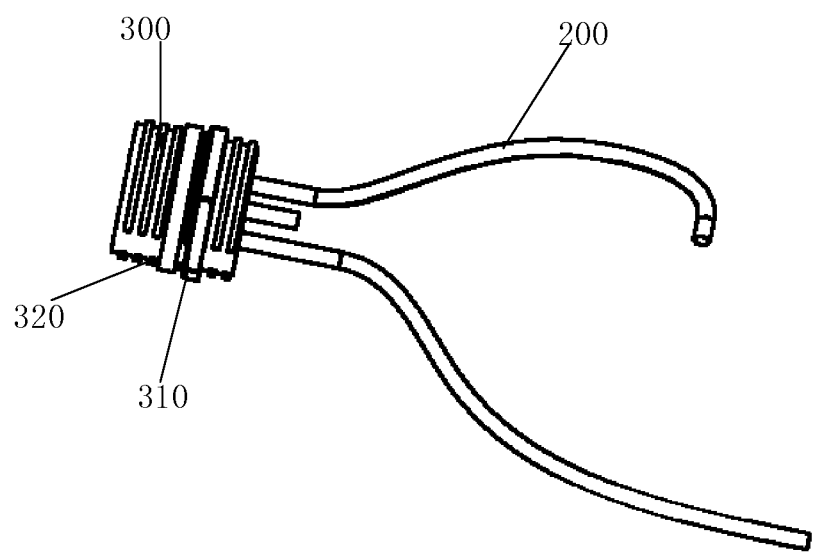
FIG. 2 is a schematic diagram showing a 3D structure of a plug in the switch assembly structure according to an embodiment of this disclosure.
Figure 3:
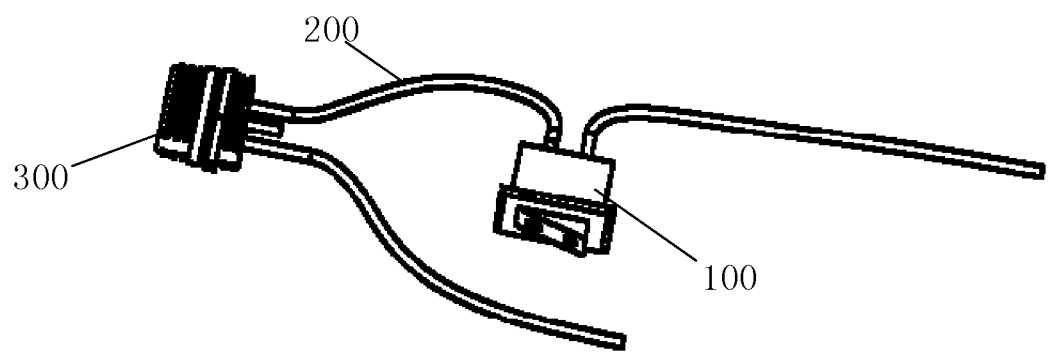
FIG. 3 is a schematic diagram showing a connection between the switch assembly and the plug in the switch assembly structure according to an embodiment of this disclosure.

Further, in conjunction with FIG. 2 to FIG. 3, in a specific embodiment of this disclosure, the switch assembly structure further comprises a plug 300 connected with the switch assembly 100 through a conductive member 200. Before mounting the switch assembly 100 to the assembly housing, firstly the switch assembly 100 and the plug 300 are connected through the conductive member 200, and then the switch assembly 100 and the plug 300 are assembled simultaneously to improve the assembling efficiency of the switch assembly 100 and the plug 300.

In addition, in the switch assembly structure described in the specific embodiment of this disclosure, the plug 300 is an aviation female plug. It can be understood that the switch assembly structure is not limited only to the assembling of the switch assembly that is connected with the aviation female plug, and the plug 300 is not limited only to the structural form of the aviation female plug.

The following is a detailed description of a specific structure when the switch assembly structure according to the embodiment of this disclosure is applied to the switch assembly of the structure shown in FIG. 1 and the plug of the structure shown in FIG. 2.

Figure 4:
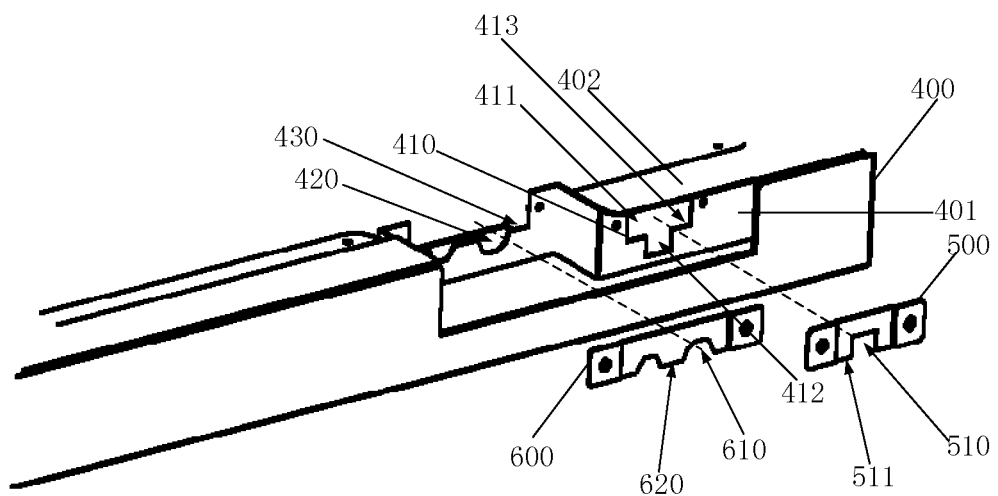
FIG. 4 is an exploded schematic diagram showing a first clamping member, a second clamping member and an assembly housing in one or more embodiments of the switch assembly structure in this disclosure.
Figure 5:
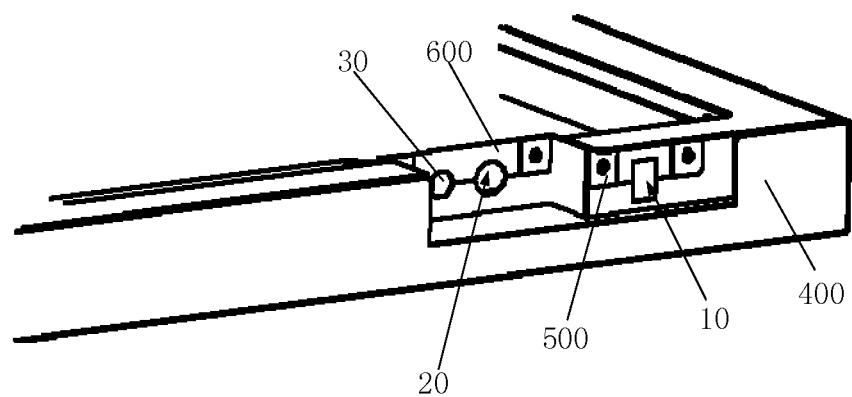
FIG. 5 is a schematic diagram showing the assembling of the structure shown in FIG. 4.
Figure 6:
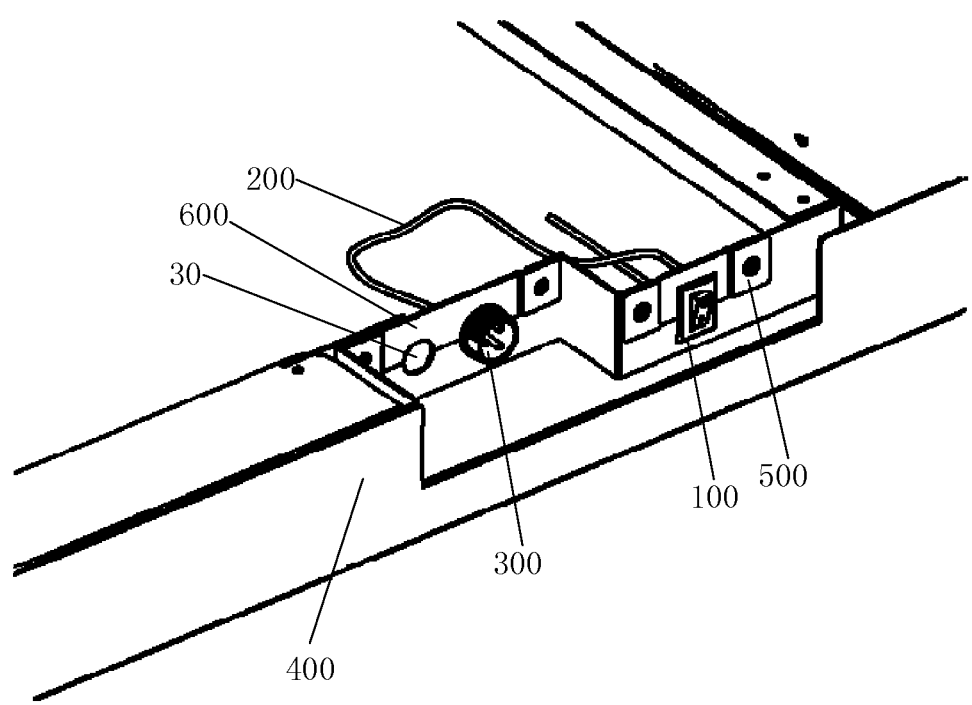
FIG. 6 is a 3D schematic diagram showing the switch assembly structure according to an embodiment of this disclosure.

As shown in FIG. 4 to FIG. 6, in one or more embodiments of the switch assembly structure of the present disclosure, the switch assembly structure comprises:

a switch assembly 100;

an assembly housing 400 provided with a first notch 410;

a first clamping member 500 provided with a second notch 510;

wherein the first clamping member 500 comprises a first state in which the second notch 510 and the first notch 410 are combined to form a switch mounting hole 10 and securely connected with the assembly housing 400 (shown in FIG. 5) and a second state of being separate from the assembly housing 400 (shown in FIG. 4).

In a specific embodiment of this disclosure, in combination with FIG. 4 and FIG. 5, in the first state, the first clamping member 500 coves one part of the first notch 410, the other part of the first notch 410 forms a switch mounting hole 10, and the second notch 510 coincides with one part of the first notch 410 that forms the switch mounting hole 10.

By referring to FIG. 4, in a specific embodiment of this disclosure, the first notch 410 is provided on a first housing part 401 of the assembly housing 401 and penetrates the opposing first end face and second end face of the first housing part 401. In addition, the assembly housing 400 further comprises a second housing part 402 combined and connected with the first housing part 401, wherein the second housing part 402 is arranged perpendicular to the first housing part 401. Through the second housing part 402, the first notch 410 arranged on the first housing part 401 is formed as a enclosed hole-shaped structure capable of making the switch assembly 100 penetrate in a reciprocating manner.

Based on the above setting, by arranging the first notch 410 which can make the switch assembly 100 penetrate in a reciprocating manner on the first housing part 401, the switch assembly 100 can penetrate in the first notch 410 in a direction of inserting from the first end face toward the second end face or from the second end face toward the first end face.

Specifically, as shown in FIG. 4, the first notch 410 comprises a first opening part 411 and a second opening part 412 communicating with each other, wherein through the first opening part 411, the whole switch assembly can penetrate in a reciprocating manner in the first notch 410.

In combination with the structure of the switch assembly 100 shown in FIG. 1, the first notch 410 forms quadrangular holes on a cross section perpendicular to the direction from the first end face to the second end face (i.e., the direction of inserting the switch assembly 100 in the first notch 410), which are symmetric with respect to the same line, that is, a centrosymmetry structures are formed.

In addition, the size of the first opening part 411 is larger than the size of the first structural part 110 of the switch assembly 100 to ensure that the switch assembly 100 can penetrate in a reciprocating manner in the first notch 410 through the first opening part 411. Further, the size of the second opening part 412 corresponds to the size of a part of the second structural part 120, and the size of the second notch 510 corresponds to the size of the other part of the second structural part 120. Combined with FIG. 4 and FIG. 5, when the first clamping member 500 is combined and connected with the assembly housing 400 (i.e., the first clamping member 500 is in the first state), the first clamping member 500 covers one part of the first opening part 411, and the second opening part 412 combines with the other part of the first opening part 411 to form the switch mounting hole 10. In other words, the second notch 510 coincides with one part of the first opening part 411, and the second notch 510 combines with the second opening part 412 to form the switch mounting hole 10.

In some embodiments of this disclosure, the shape and size of the switch mounting hole 10 correspond to the shape and size of the second structural part 120 of the switch assembly 100. When the switch assembly 100 penetrates through the first opening part 411 into the first notch 410, a part of the second structural part 120 of the switch assembly 100 is clamped in the second opening part 412, then the first clamping member 500 is mounted on the assembly housing 400, wherein the second notch 510 corresponds to the other part in which the second structural part 120 is clamped. The second structural part 120 is clamped in the switch mounting hole 10 formed by combining the first clamping member 500 with the assembly housing 400. Since the second structural part 120 of the switch assembly 100 is usually made of an elastic plastic material, by using the pression of the first clamping member 500 with respect to the second structural part 120, the securement of the second structural part 120 on the assembly housing 400 can be guaranteed.

Further, in some embodiments of this disclosure, as shown in FIGS. 4 to 6, the first notch 410 penetrates the opposing first end face and second end face of the assembly housing 400, and the second notch 510 penetrates the opposing first surface and second surface of the first clamping member 500. In the first state (the first clamping member 500 is securely connected with the assembly housing 400), the first end face is in the same plane as the first surface and the second end face is in the same plane as the second surface. That is, specifically, a thickness between the first end face and the second end face is equal to a thickness between the first surface and the second surface. In addition, inside the first notch 410, a top face 413 is formed between the first opening part 411 and the second opening part 412, while the first clamping member 500 is formed as a bent sheet structure, a middle part in which the second notch 510 is arranged is bent towards the assembly housing 400 with respect to the parts on both sides, and a bottom face 511 is included. When the first clamping member 500 and the assembly housing 400 are combined to be mounted, the parts on both sides of a middle part of the first clamping member 500 in which the second notch 510 is arranged respectively fit and connect the assembly housing 400. By use of the form of bent structure, the bottom face 511 is opposing to the top face 413 inside the first notch 410. In this way the first end face of the assembly housing 400 is located in the same plane as the first surface of the first clamping member 500, and the second end face of the assembly housing 400 is located in the same plane as the second surface of the first clamping member 500, so that the various parts forming the switch mounting hole 10 are located on the same end face to ensure that the switch assembly 100 is firmly secured in the switch mounting hole 10.

In addition, the parts of the first clamping member 500 on both sides of the second notch 510 are securely connected with the assembly housing 400, for example, by screws.

For the switch assembly structure according to the embodiment of this disclosure, by setting that the first clamping member 500 and the assembly housing 400 combine to form a switch mounting hole for mounting the switch assembly 100, the mounting of the switch assembly 100 on the assembly Housing 400 is no longer restricted in the insertion direction, so as to satisfy the requirements of being mounted on the assembly housing while connecting with the plug.

In some embodiments of this disclosure, as shown in FIGS. 4 to 6, the switch assembly structure according to an embodiment of this disclosure further comprises:

a second clamping member 600 provided with a fourth notch 610, wherein the assembly housing 400 is provided with a third notch 420 mating with the fourth notch 610;

wherein the second clamping member 600 comprises a third state of being securely connected with the assembly housing 400 and a fourth state of being separate from the assembly housing 400, wherein, in the third state, the third notch 420 and the fourth notch 610 combine to form the plug mounting hole 20.

According to FIG. 2, when the plug 300 is formed as a cylindrical structure, a cross section perpendicular to the direction of inserting the plug 300 is formed as a circular shape. In an embodiment of this disclosure, the direction of inserting the plug 300 is the direction of insertion when the plug 300 is generally mounted. In addition, on the cross section perpendicular to the direction of inserting the plug 300, the plug mounting hole 20 is formed as a circular shape corresponding to the cross section of the plug 300.

Specifically, on the cross section perpendicular to the direction of inserting the plug 300, the third notch 420 and the fourth notch 610 are respectively formed as a semicircular shape, the third notch 420 is formed as one part of the plug mounting hole 20, and the fourth notch 610 is formed as the other part of the plug mounting hole 20.

By referring to FIGS. 4 to 6, the third notch 420 penetrates the opposing third end surface and fourth end face of the assembly housing 400, the fourth notch 610 penetrates the opposing third surface and fourth surface of the second clamping member 600, and a thickness between the third end face and the fourth end face is the same with a thickness between the third surface and the fourth surface. In the third State, the third end face is in the same plane as the third surface, and the fourth end face is in the same plane as the fourth surface.

Specifically, the assembly housing 400 further comprise a fifth end face 430 connected with the third end face and the fourth end face, wherein the third notch 420 is communicated to the fifth end face 430. The second clamping member 600 is formed as a bent sheet structure, a middle part in which the fourth notch 610 is arranged is bent towards the assembly housing 400 with respect to the parts on both sides, and the second clamping member 600 further comprises a fifth surface 620 connected with the third surface and the fourth surface, wherein the fourth notch 610 is connected to the fifth surface 620.

When the second clamping member 600 and the assembly housing 400 are combined to be mounted, the parts on both sides of the part of the second clamping member 600 in which the fourth notch 610 is arranged respectively fit and connect the assembly housing 400, and the fifth surface 620 of the second clamping member 600 opposes and fits the fifth end face 430 of the assembly housing 400. In this way the third end face of the assembly housing 400 is located in the same plane as the third surface of the second clamping member 600, and the fourth end face of the assembly housing 400 is located in the same plane as the fourth surface of the second clamping member 600, so that the various parts forming the plug mounting hole 20 are located on the same end face to ensure that the plug is firmly secured in the plug mounting hole 10.

In addition, the second clamping member 600 on both sides of the fourth notch 610 is securely connected with the assembly housing 400, for example, by screws.

In some embodiments of this disclosure, as shown in FIG. 5 and FIG. 6, the second clamping member 600 and the assembly housing 400 can also be spliced together to form another port mounting hole 30, and a structure for specifically forming the port mounting hole 30 can be the same as that for forming the plug mounting hole 20, which is omitted herein.

By using the above switch assembly structure, in combination with FIG. 1 to FIG. 6, when the switch assembly 100 and the plug 300 connected through the conductive member 200 are mounted on the assembly housing 400, firstly the conductive member 200, the switch assembly 100 and the plug 300 are respectively arranged on a side of the assembly housing 400 toward the inside of the mounted display device when forming the display device. Thereafter, the switch assembly 100 is mounted in the first notch 410 of the assembly housing 400, the plug 300 is mounted in the third notch 420 of the assembly housing 400, and then the first clamping member 500 and the second clamping member 600 are respectively combined with the assembly housing 400, to realize mounting of the plug 300 and the switch assembly 100 on the assembly housing 400.

In some embodiments of this disclosure, as shown in FIG. 2, the plug 300 is formed as a threaded structure and is provided with an annular protrusion 310. When the plug 300 is mounted on the assembly housing 400, the plug 300 can be secured on the assembly housing 400 by screwing mating nuts 320 on the outside of the assembly housing 400.

In addition, when the switch assembly 100 is mounted on the assembly housing 400, the switch mounting hole 10 mates and connects with the second structural part 120 of the switch assembly 100, and by using pressing of the first clamping member 500 with respect to the second structural part 120, the second structural part 120 is secured on the assembly housing 400. In addition, since the first structural part 110 with a larger size is located outside the assembly housing 400, it can further prevent the switch assembly 100 from loosening from the assembly housing 400.

For the switch assembly structure according to the embodiment of this disclosure, by setting that the first clamping member and the assembly housing combine to form a switch mounting hole, when mounting the switch assembly, the switch assembly can be firstly mounted on the first clamping member or the assembly housing and then is secured, and thus in this way, the mounting of the switch assembly is unnecessarily restricted in the direction from the outside of the assembly housing to the inside thereof, so as to satisfy the requirements of being mounted on the assembly housing while connecting with the plug.

Based on the setting principle of the switch assembly structure in the embodiments of this disclosure, the structure in which the first clamping member mates and connects with the assembly housing to form the switch mounting hole is not limited to the above manner. For example, the second notch on the first clamping member can be sized to enable the entire switch assembly to penetrate, and when the first clamping member is securely connected with the assembly housing, by covering a part of the first clamping member in which the second notch is arranged with the assembly housing, the other part of the second notch is formed as a switch mounting hole, and the first notch coincides with the part of the second notch in which the switch mounting hole is formed. In other words, by covering a part of the notch arranged on the first clamping member with the assembly housing, the two parts combine to form the switch mounting holes for mounting the switch assembly.

Figure 7:
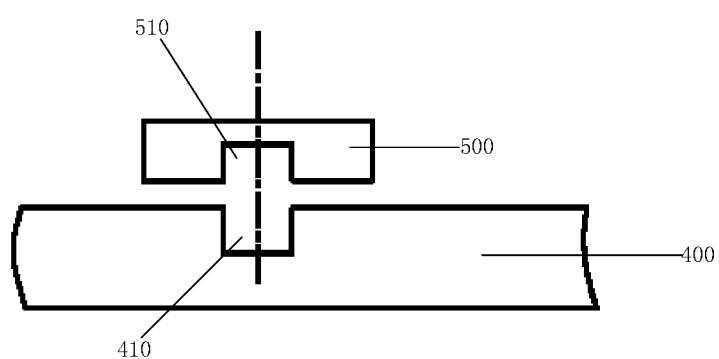
FIG. 7 is a schematic diagram showing a planar structure of the first clamping member and the assembly housing in one or more embodiment structure of the switch assembly structure in this disclosure.

FIG. 7 shows another structural form in which the first clamping member 500 mates with the assembly housing 400. The first notch 410 arranged on the assembly housing 400 is formed as a part of the switch mounting hole, the second notch 510 arranged on the first clamping member 500 is formed as the other part of the switch mounting hole, and the first notch 410 opposes the second notch 510 to form a switch mounting hole. When mounting the switch assembly, the switch assembly can be firstly inserted from the opening of the first notch 410 or the second notch 510, and the switch assembly is mounted in one of the assembly housing 400 and the first clamping member 500, and then combines with the other thereof to secure the switch assembly.

The above merely shows several embodiments in which the first clamping member combines with the assembly housing to form a switch mounting hole, but it is not limited to only the above several embodiments.

In another aspect of the embodiments of this disclosure, a display device is further provided, comprising the switch assembly structure according to any of the above embodiments. By using the display device of the switch assembly structure, inside the display device, an connecting end of the switch assembly is connected to the power supply, and the other connecting end thereof is connected to the plug through a conductive member, and the plug is connected with motherboard circuits inside the display device.

In combination with FIG. 1 to FIG. 7, and according to the above detailed description of the switch assembly structure, those skilled in the art would appreciate the specific structure of the display device adopting the switch assembly structure, which is omitted herein.

For the display device according to the embodiment of this disclosure, when mounting the switch assembly, the switch assembly can be firstly mounted on the first clamping member or the assembly housing and then is secured, and the mounting of the switch assembly is unnecessarily restricted in the direction from the outside of the assembly housing to the inside thereof, so as to satisfy the requirements of being mounted on the assembly housing while connecting with the plug, and as compared with the related technologies, the efficiency of assembling the switch assembly and the plug can be improved.

In a further aspect of the embodiments of this disclosure, an assembling method of the switch assembly structure is provided, wherein the assembling method comprises:

when the first clamping member is in a second state, fitting the switch assembly with the first notch of the assembly housing, or fitting the switch assembly with the second notch of the first clamping member;

disposing the first clamping member in opposite to the assembly housing so that the first notch and the second notch combine to form a switch mounting hole, wherein the switch assembly is arranged in the switch mounting hole; and securely connecting the first clamping member be with the assembly housing, wherein the first clamping member is in the first state.

Further, when the switch assembly structure further comprises a plug connected with the switch assembly through a conductive member, and the assembly housing is further provided with a plug mounting hole, when the first clamping member is in the second state, before fitting the switch assembly with the first notch of the assembly housing or fitting the switch assembly with the second notch of the first clamping member, the method further comprises:

respectively arranging the plug and the switch assembly connected through the conductive member on a side of the assembly housing toward the inside of the display device when forming the display device;

wherein, when fitting the switch assembly with the first notch of the assembly housing or fitting the switch assembly with the second notch of the first clamping member, the method further comprises:

inserting the plug in the plug mounting hole in a direction from a side of the assembly housing toward the inside of the display device to a side thereof toward the outside of the display device.

By using the assembling method of the switch assembly structure according to the embodiment of this disclosure, when mounting the switch assembly, the switch assembly can be firstly mounted on the first clamping member or the assembly housing and then is secured by the securement of the first clamping member and the assembly housing, and the mounting of the switch assembly is unnecessarily restricted in the direction from the outside of the assembly housing to the inside thereof, so as to satisfy the requirements of being mounted on the assembly housing while connecting with the plug, and as compared with the related technologies, the efficiency of assembling the switch assembly and the plug can be improved.

Alternative embodiments of this disclosure are described above, but it should be noted that, persons of ordinary skill in the art may make various modifications and embellishments without departing from the principle of this disclosure, and all these modifications and embellishments are also within the scope of protection of this disclosure.

What is claimed is:

1. A switch assembly structure comprising:
   a switch assembly;
   an assembly housing provided with a first notch;
   a first clamping member provided with a second notch, the first clamping member has a first state of being securely connected with the assembly housing and a second state of being separate from the assembly housing;
   wherein, in the second state, the switch assembly is able to mate with the first notch or the second notch; and in the first state, the first notch and the second notch combine to form a switch mounting hole, and the switch assembly is secured in the switch mounting hole by a securable connection of the first clamping member with the assembly housing,
   wherein in the first state, the first clamping member covers a part of the first notch, other part of the first notch is formed as the switch mounting hole, and the second notch coincides with a part of the other part of the first notch that forms the switch mounting hole.

2. The switch assembly structure according to claim 1, wherein the first notch is formed as a hole-shaped structure capable of making the switch assembly penetrate in a reciprocating manner.

3. The switch assembly structure according to claim 2, wherein the first notch comprises a first opening part and a second opening part communicating with each other, and through the first opening part, the whole switch assembly is able to penetrate the first notch in a reciprocating manner;
   wherein, the first clamping member covers a part of the first opening part in the first state, and the second opening part combines with other part of the first opening part to form the switch mounting hole.

4. The switch assembly structure according to claim 3, wherein the first opening part and the second opening part are respectively formed as quadrangular holes on a cross section perpendicular to a direction of inserting the switch assembly, which are symmetric with respect to the same line.

5. The switch assembly structure according to claim 1, wherein in the first state, the assembly housing covers a part of the second notch, and other part of the second notch is formed as the switch mounting hole, and the first notch coincides with the part of the second notch that forms the switch mounting hole.

6. The switch assembly structure according to claim 1, wherein
   the switch assembly comprises a first structural part and a second structural part connected to each other, wherein a sectional area of the first structural part is larger than a sectional area of the second structural part, on a cross section parallel to a plane where the switch mounting hole is located;
   wherein, in the first state, a part of the second structural part is secured in the switch mounting hole, and the first structural part is located on an outer surface of the assembly housing.

7. The switch assembly structure according to claim 1, wherein the first notch penetrates opposing first end face and second end face of the assembly housing, and the second notch penetrates opposing first surface and second surface of the first clamping member;
   wherein, in the first state, the first end face is in the same plane as the first surface and the second end face is in the same plane as the second surface.

8. The switch assembly structure according to claim 7, wherein the first clamping member is formed as a bent sheet structure, and a middle part of the first clamping member in which the second notch is arranged is bent towards the assembly housing with respect to parts on both sides of the middle part of the first clamping member.

9. The switch assembly structure according to claim 1, wherein the switch assembly structure further comprises:
   a plug connected with the switch assembly through a conductive member;
   wherein, the assembly housing is further provided with a plug mounting hole, wherein the plug is inserted in the plug mounting hole.

10. The switch assembly structure according to claim 9, wherein the assembly housing is further provided with a third notch;
    wherein the switch assembly structure further comprises:
    a second clamping member provided with a fourth notch;
    wherein the second clamping member has a third state of being securely connected with the assembly housing and a fourth state of being separate from the assembly housing,
    wherein, in the third state, the third notch and the fourth notch combine to form the plug mounting hole.

11. The switch assembly structure according to claim 10, wherein the plug is formed as a circular shape on a cross section perpendicular to a direction of plug insertion, and on the cross section perpendicular to the direction of plug insertion, the plug mounting hole is formed as a circular shape corresponding to the cross section of the plug.

12. The switch assembly structure according to claim 10, wherein on a cross section perpendicular to a direction of plug insertion, the third notch and the fourth notch are respectively formed as a semicircular shape, and the third notch is formed as a part of the plug mounting hole, and the fourth notch is formed as other part of the plug mounting hole.

13. The switch assembly structure according to claim 10, wherein the third notch penetrates opposing third end surface and fourth end face of the assembly housing, and the fourth notch penetrates opposing third surface and fourth surface of the second clamping member;
    wherein, in the third State, the third end face is in the same plane as the third surface, and the fourth end face is in the same plane as the fourth surface.

14. The switch assembly structure according to claim 13, wherein the second clamping member is formed as a bent sheet structure, and a middle part of the second clamping member in which the fourth notch is arranged is bent towards the assembly housing with respect to parts on both sides of the middle part of the second clamping member.

15. A display device comprising a switch assembly structure, the switch assembly structure comprises
    a switch assembly;
    an assembly housing provided with a first notch;
    a first clamping member provided with a second notch, the first clamping member has a first state of being securely connected with the assembly housing and a second state of being separate from the assembly housing;

wherein, in the second state, the switch assembly is able to mate with the first notch or the second notch; and in the first state, the first notch and the second notch combine to form a switch mounting hole, and the switch assembly is secured in the switch mounting hole by a securable connection of the first clamping member with the assembly housing, wherein in the first state, the first clamping member covers a part of the first notch, other part of the first notch is formed as the switch mounting hole, and the second notch coincides with a part of the other part of the first notch that forms the switch mounting hole.

16. The display device according to claim 15, wherein the switch assembly structure further comprises:

a plug connected with the switch assembly through a conductive member;

wherein, the assembly housing is further provided with a plug mounting hole, wherein the plug is inserted in the plug mounting hole.

17. The display device according to claim 16, wherein the assembly housing is further provided with a third notch;

wherein the switch assembly structure further comprises:

a second clamping member provided with a fourth notch;

wherein the second clamping member has a third state of being securely connected with the assembly housing and a fourth state of being separate from the assembly housing, wherein, in the third state, the third notch and the fourth notch combine to form the plug mounting hole.

* * * * *